United States Patent
Cherko

(10) Patent No.: US 6,285,011 B1
(45) Date of Patent: Sep. 4, 2001

(54) ELECTRICAL RESISTANCE HEATER FOR CRYSTAL GROWING APPARATUS

(75) Inventor: Carl F. Cherko, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/416,432

(22) Filed: Oct. 12, 1999

(51) Int. Cl.[7] .................. C30B 15/16; C30B 35/00; H05B 3/02; F27B 14/14
(52) U.S. Cl. ................ 219/426; 219/424; 117/217
(58) Field of Search .................... 219/424, 426, 219/552; 373/130; 338/58, 284; 117/217

(56) References Cited

U.S. PATENT DOCUMENTS

| | | | |
|---|---|---|---|
| 1,864,334 | * 6/1932 | Baily | 338/284 |
| 1,901,499 | * 3/1933 | Fahrenwald | 373/130 |
| 1,928,142 | * 9/1933 | Trent et al. | 338/58 |
| 3,359,077 | 12/1967 | Arst | 23/301 |
| 3,860,736 | 1/1975 | Ford | 13/20 |

(List continued on next page.)

FOREIGN PATENT DOCUMENTS

| | | |
|---|---|---|
| 0 504 837 A2 | 9/1992 | (EP) . |
| 08104593 | 4/1996 | (EP) . |
| 0716168A1 | 6/1996 | (EP) . |
| 0 798 404 A2 | 10/1997 | (EP) . |
| 0 823 497 A1 | 2/1998 | (EP) . |
| 11139895 | 5/1999 | (EP) . |
| 11199371 | 7/1999 | (EP) . |
| 8520574 | 2/1986 | (GB) . |
| 58-120591 | 7/1983 | (JP) . |
| 60-155594 | 8/1985 | (JP) . |
| 61-201692 | 9/1986 | (JP) . |
| 62-223090 | 10/1987 | (JP) . |
| 03-093700 | 4/1991 | (JP) . |
| 04-305087 | 10/1992 | (JP) . |
| 05-043385 | 2/1993 | (JP) . |
| 6-036368 | 2/1994 | (JP) . |
| 06-087686 | 3/1994 | (JP) . |
| 60-092780 | 4/1994 | (JP) . |
| 08-012493 | 1/1996 | (JP) . |
| 10-139600 | 5/1998 | (JP) . |

OTHER PUBLICATIONS

Hourai, et al.; Oxygen Precipitation Behavior in Silicon During Czochralski Crystal Growth; Silicon Technology R&D Center (Undated).

Primary Examiner—Joseph Pelham
(74) Attorney, Agent, or Firm—Senniger, Powers, Leavitt & Roedel

(57) ABSTRACT

An electrical resistance heater for use in a crystal puller used for growing monocrystalline ingots according to the Czochralski method comprises a heating element sized and shaped for placement in the housing of the crystal puller for radiating heat within the housing. The heating element has heating segments arranged in a generally side-by-side relationship and electrically connected together. Each heating segment comprises a web and a flange projecting outwardly from the web in non-coplanar relationship therewith. This reduces the cross-sectional area of the heating segment for increasing the electrical resistance and power output of the heater while providing desired structural rigidity.

11 Claims, 3 Drawing Sheets

U.S. PATENT DOCUMENTS

| | | | |
|---|---|---|---|
| 4,147,888 * | 4/1979 | Sato | 219/552 |
| 4,410,796 | 10/1983 | Wilsey | 219/553 |
| 4,533,822 | 8/1985 | Fuji et al. | 219/553 |
| 4,597,949 | 7/1986 | Jasinski et al. | 422/249 |
| 4,604,262 | 8/1986 | Nishizawa | 422/310 |
| 4,748,315 | 5/1988 | Takahashi et al. | 219/275 |
| 4,813,373 | 3/1989 | Demay et al. | 118/726 |
| 4,910,383 | 3/1990 | Zimmer | 219/233 |
| 4,973,377 | 11/1990 | Katsuoka et al. | 156/601 |
| 4,981,549 | 1/1991 | Yamashita et al. | 156/620 |
| 5,132,091 | 7/1992 | Azad | 422/249 |
| 5,137,699 | 8/1992 | Azad | 422/246 |
| 5,248,378 | 9/1993 | Oda et al. | 156/617 |
| 5,575,847 | 11/1996 | Kuramochi et al. | 117/210 |
| 5,667,584 | 9/1997 | Takano et al. | 117/13 |
| 5,766,347 | 6/1998 | Shimomura et al. | 117/217 |
| 5,824,149 | 10/1998 | Li | 117/14 |
| 5,840,120 | 11/1998 | Kim et al. | 117/208 |
| 5,911,825 | 6/1999 | Groat et al. | |
| 6,093,913 * | 7/2000 | Schrenker et al. | 219/424 |

* cited by examiner

ELECTRICAL RESISTANCE HEATER FOR CRYSTAL GROWING APPARATUS

Background of the Invention

The present invention relates generally to crystal growing apparatus used in growing monocrystalline ingots, and more particularly to an electrical resistance heater for use in such a crystal growing apparatus.

Single crystal silicon, which is the starting material for most semiconductor electronic component fabrication, is commonly prepared by the so-called Czochralski ("Cz") method. The growth of the crystal is most commonly carried out in a crystal pulling furnace. In this method, polycrystalline silicon ("polysilicon") is charged to a crucible and melted by heat generated by a crucible heater surrounding the crucible side wall. A seed crystal is brought into contact with the molten silicon and a single crystal ingot is grown by slow extraction via a crystal puller. After formation of a neck is complete, the diameter of the crystal ingot is enlarged by decreasing the pulling rate and/or the melt temperature until the desired or target diameter is reached.

The cylindrical main body of the crystal which has an approximately constant diameter is then grown by controlling the pull rate and the melt temperature while compensating for the decreasing melt level. Near the end of the growth process, the crystal diameter must be reduced gradually to form an end-cone. Typically, the end-cone is formed by increasing the pull rate and heat supplied to the crucible. When the diameter becomes small enough, the ingot is then separated from the melt.

Crucible heaters used for melting silicon in the crucible are typically electrical resistance heaters in which an electrical current flows through a heating element constructed of a resistive heating material (e.g., graphite). The resistance to the flow of current generates heat that radiates from the heating element to the crucible and silicon contained therein. The heating element comprises vertically oriented heating segments of equal length and rectangular cross-section arranged in side-by-side relationship and connected to each other in a serpentine configuration. That is, adjacent segments are connected to each other at the tops or bottoms of the segments in an alternating manner to form a continuous electrical circuit throughout the heating element. The heating power generated by the heating element is generally a function of the cross-sectional area of the rectangular segments and the current input to the heating element. Input current to the heater is typically limited to about 60 volts to inhibit arcing between the heater and any surrounding grounding surfaces of the crystal puller.

Although the conventional apparatus used for growing single crystal silicon according to the Czochralski growth method has been satisfactory for growing crystal ingots useful in a wide variety of applications, further improvements in the quality of the semiconductor material are desirable. As the width of integrated circuit lines formed on the semiconductor material continue to be reduced, the presence of defects in the crystal become of greater concern. A number of defects in single crystal silicon form in the crystal growth chamber as the crystal cools after solidification. Such defects arise, in part, because of the presence of an excess (i.e., a concentration above the solubility limit) of intrinsic point defects, which are known as vacancies and self-interstitials.

One important measurement of the quality of wafers sliced from a singlecrystal ingot is Gate Oxide Integrity ("GOI"). Vacancies, as their name suggests, are caused by the absence or "vacancy" of a silicon atom in the crystal lattice. When the crystal is pulled upward from the molten silicon in the crucible, it immediately begins to cool. As the temperature of the crystal ingot descends through the temperature range of 1150 ° C. down to 1050 ° C., vacancies present in the ingot tend to migrate out toward the outer surface of the ingot or agglomerate together within the ingot. These agglomerations are manifested as pits within the surfaces of the wafers sliced from the crystal ingot.

Silicon wafers sliced from the ingot and manufactured according to conventional processes often include a silicon oxide layer formed on the surface of the wafer. Electronic circuit devices such as MOS devices are fabricated on this silicon oxide layer. Defects in the surface of the wafer, caused by the agglomerations present in the growing crystal, lead to poor growth of the oxide layer. The quality of the oxide layer, often referred to as the oxide film dielectric breakdown strength, may be quantitatively measured by fabricating MOS devices on the oxide layer and testing the devices. The Gate Oxide Integrity (GOI) of the crystal is the percentage of operational devices on the oxide layer of the wafers processed from the crystal.

It has been determined that the GOI of crystals grown by the Czochralski method can be improved by increasing the amount of time a growing ingot dwells in the temperature range above 1000° C., and more particularly in the range of 1150° C.–1050° C. If the ingot cools too quickly through this temperature range, the vacancies will not have sufficient time to agglomerate together, resulting in a large number of small agglomerations within the ingot. This undesirably leads to a large number of small pits spread over the surfaces of the wafer, thereby negatively affecting GOI. Slowing down the cooling rate of the ingot so that its temperature dwells in the target temperature range for a longer period of time allows more vacancies to move to the outer surface of the ingot or form large agglomerations within the ingot. The result is a small number of large agglomerations, thereby improving GOI by decreasing the number of defects present in the surface of the wafer upon which the MOS devices are formed.

To this end, co-assigned U.S. application Ser. No. 60/090, 798, filed Jun. 26, 1998, discloses a second, or upper electrical resistance heater for use in a crystal puller used for growing monocrystalline silicon ingots according to the Czochralski method which is sized and shaped for placement in the housing of the crystal puller generally above the crucible in spaced relationship with the outer surface of the growing ingot. The upper heater radiates heat to the ingot as the ingot is pulled upward in the housing relative to the molten silicon. This upper heater is constructed in a manner similar to conventional crucible heaters in that it comprises vertically oriented heating segments arranged in side-by-side relationship and connected to each other to form an electrical circuit. The heater has opposing mounting brackets extending upward from the segments for mounting the upper heater on the wall of the upper pull chamber. The upper heater is preferably capable of radiating heat at a temperature in the range of 1000° C.–1100° C. The heating segments may vary in length to define a profiled heater in which the heater radiates more heat to the crystal ingot at the top of the heater than at its bottom.

Over time, it has become desirable to further lengthen the heating segments of the upper heater to maintain the temperature of the growing ingot above 1,050° C. for as long as possible. However, as the lengths of the heating segments increase within the limited radial space available in the crystal puller housing, the segments become more fragile.

The heater would thus become less robust in the radial direction and subject to a greater risk of damage caused by bending, particularly during handling such as installation in or removal from the crystal puller housing. Increasing the cross-sectional area of the segments would certainly increase the radial bending stiffness of the segments, but would undesirably reduce the electrical resistance of the segments, thereby reducing the total power output of the heater for a predetermnined input current.

SUMMARY OF THE INVENTION

Among the several objects and features of the present invention may be noted the provision of an electrical resistance heater for use in a crystal puller which facilitates the growth of low defect monocrystalline silicon ingots in the puller; the provision of such a heater which has sufficient structural strength; the provision of such a heater having an improved power output at the same electrical current input; the provision of such a heater capable of carrying an increased current input; the provision of such a heater having increased electrical resistance; the provision of such a heater which is efficient to operate; and the provision of such a heater which is easy to install in the crystal puller.

Generally, an electrical resistance heater of the present invention for use in a crystal puller used for growing monocrystalline ingots according to the Czochralski method comprises a heating element sized and shaped for placement in the housing of the crystal puller for radiating heat within the housing. The heating element has heating segments arranged in a generally side-by-side relationship and electrically connected together. Each heating segment comprises a web and a flange projecting outwardly from the web in non-coplanar relationship therewith. This reduces the cross-sectional area of the heating segment for increasing the electrical resistance and power output of the heater.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
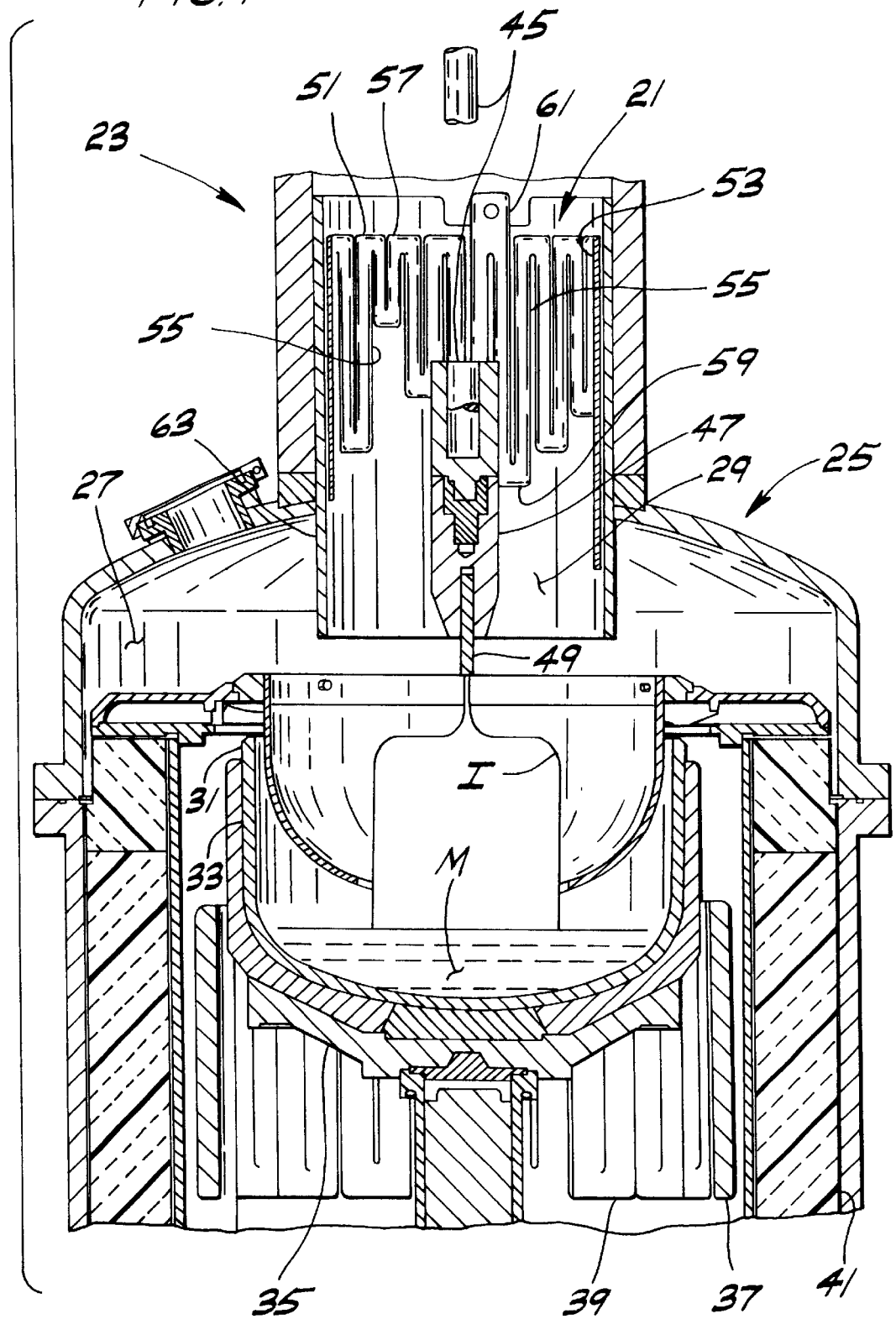
FIG. 1 is a schematic, fragmentary vertical section of a crystal puller showing an electrical resistance heater of a first embodiment of the present invention as it is positioned during growth of a single crystal silicon ingot.

Referring now to the drawings and in particular to FIG. 1, an electrical resistance heater constructed according to the principles of the present invention is generally indicated at 21. The heater 21 is preferably for use in a crystal puller, indicated generally at 23, of the type used to grow monocrystalline silicon ingots (e.g., ingot I of FIG. 1) according to the Czochralski method. The crystal puller 23 includes a housing (generally indicated at 25) for isolating an interior which includes a lower crystal growth chamber 27 and an upper pull chamber 29. The pull chamber 29 has a smaller transverse dimension than the growth chamber. A quartz crucible 31 contains molten semiconductor source material M (e.g., silicon) from which the monocrystalline ingot I is grown. The crucible 31 includes a cylindrical side wall 33 and is mounted on a turntable 35 for rotation about a vertical axis. The crucible 31 is also capable of being raised within the growth chamber 27 to maintain the surface of the molten source material M at the same level as the ingot I is grown and source material is removed from the melt.

A crucible heater, generally indicated at 37, for melting the source material M in the crucible 31 includes a generally vertically oriented heating element 39 surrounding the crucible in radially spaced relationship with the side wall 33 of the crucible. The heating element 39 heats the crucible 31 and the interior of the crystal puller housing 25 to temperatures above the melting point of the source material M. Insulation 41 is positioned to confine the heat to the interior of the housing 25. In addition, there are passages (not shown) in the housing 25, including the wall of the upper pull chamber 29, for circulation of cooling water.

A pulling mechanism includes a pull shaft 45 extending down from a mechanism (not shown) above the pull chamber 29 capable of raising, lowering and rotating the pull shaft. The crystal puller 23 may have a pull wire (not shown) rather than a shaft 45, depending upon the type of puller. The pull shaft 45 terminates in a seed crystal chuck 47 which holds a seed crystal 49 used to grow the monocrystalline ingot I. The pull shaft 45 has been partially broken away in FIG. 1 for clarity in illustration of a raised position of the seed chuck 47 and ingot I. The general construction and operation of the crystal puller 23, except to the extent explained more fully below, is well known to those of ordinary skill in the art and will not be further described.

The electrical resistance heater 21 of the present invention comprises a generally tubular heating element 51 mounted in the upper pull chamber 29 of the housing 25 adjacent the dome-shaped upper wall of the lower growth chamber 27. The heating element 51 extends downward into the crystal growth chamber 27, terminating substantially above the crucible 31 containing the molten source material M. A central opening 53 of the heating element 51 allows the growing ingot I to pass centrally through the heating element as it is pulled upward through the housing 25 of the puller 23.

Figure 2:
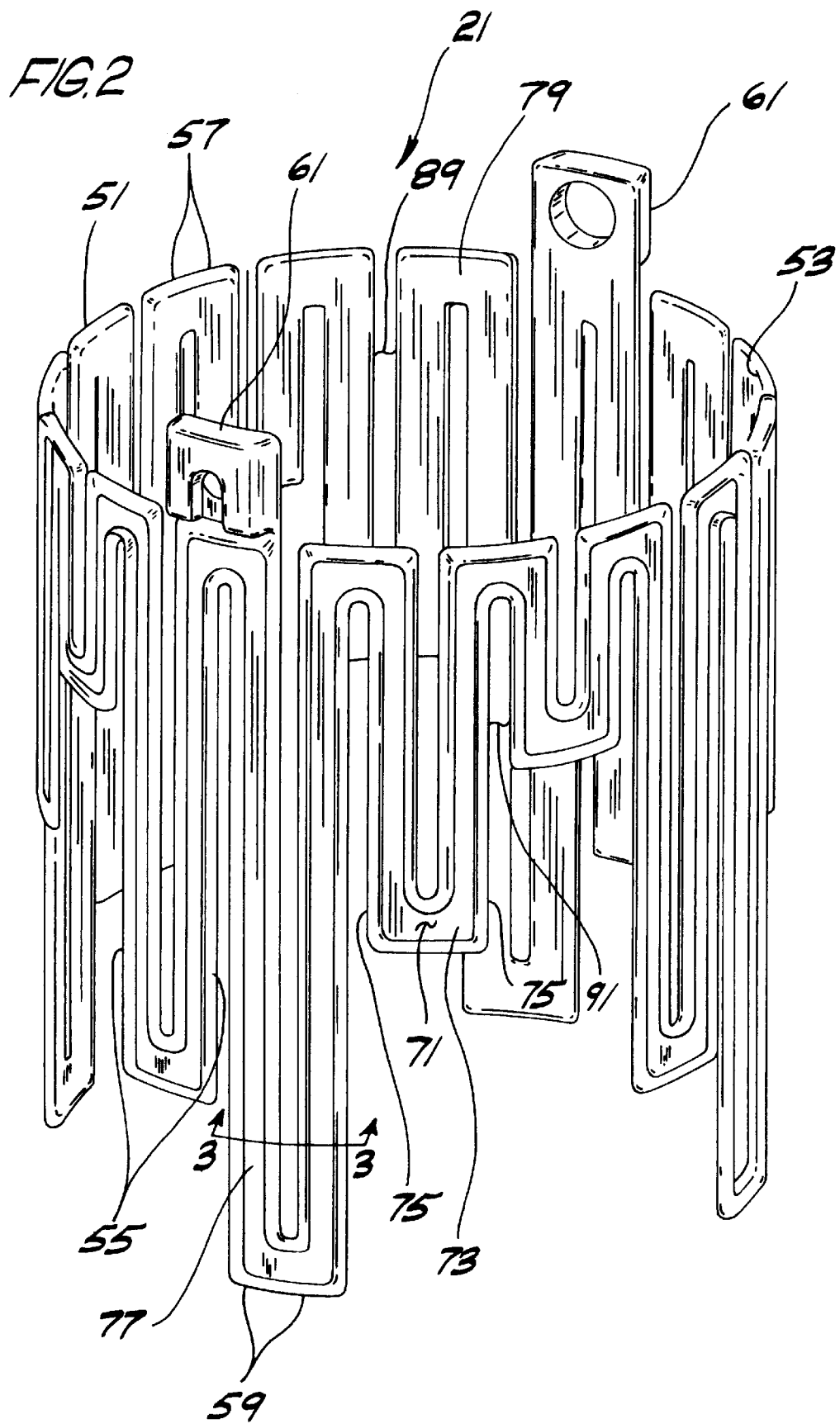
FIG. 2 is a perspective view of the electrical resistance heater of FIG. 1.

As shown in FIG. 2, the heating element 51 comprises vertically oriented heating segments 55 arranged in side-by-side relationship and connected to each other to form an electrical circuit. More particularly, upper and lower ends, designated 57 and 59, respectively, of adjacent heating segments 55 are alternatingly connected to each other in a continuous serpentine configuration forming a closed geometric shape; in the illustrated embodiment, a cylinder. Opposing mounting brackets 61 are connected to the top of the heating element 51 in electrical connection with the heating segments 55 and extend upward from the heating element for mounting the heater 21 on the wall of the upper pull chamber 29.

Openings (not shown) in the wall of the upper pull chamber 29 allow the mounting brackets 61 to be electrically connected to a source of electrical current (not shown) by conventional electrodes (not shown) extending through the openings for connection with the mounting brackets to conduct current through the heating element 51. The voltage input by the electrodes to the heater 21 is preferably limited to about 60 volts to inhibit arcing between the heater and any grounded surfaces of the crystal puller. A tubular heat shield 63 (FIG. 1), preferably constructed of graphite, is disposed generally between the heating element 51 and the wall of the upper pull chamber 29 to inhibit cooling of the heating element by the water cooled side wall.

The heating element 51 is constructed of a non-contaminating resistive heating material which provides resistance to the flow of electrical current therethrough; the power output generated by the heating element increasing with the electrical resistance of the material. A particularly preferred resistive heating material is silicon carbide coated graphite. However, the heating element 51 may be constructed of other suitable materials such as highly purified extruded graphite, isomolded graphite, carbon fiber composite, tungsten, metal or other suitable materials without departing from the scope of this invention. The heating element 51 is preferably capable of radiating heat at a temperature in the range of 1000° C.–1100° C.

Still referring to FIG. 2, the heating segments 55 of the heating element 51 are of varying lengths, with the upper ends 57 of the segments being co-planar about the circumference of the heating element at the top of the heating element and the lower ends 59 of the segments being staggered vertically with respect to each other because of the varying lengths of the segments. The lower ends 59 of the longest segments define the bottom of the heating element 51. As an example, the heating segments 55 of the heating element 51 shown in FIG. 1 are of four different lengths. The shortest segments extend down to approximately 105 mm below the top of the heating element 51 while the longest segments extend down to approximately 350 mm below the top of the heating element. Thus, it will be seen that the first 105 mm of every heating segment 55 extending downward from the top are radially opposite a portion of the crystal ingot I so that the heating element 51 surrounds substantially the entire circumference of the ingot near the top of the heating element. In contrast, the longest heating segments are in radially opposed relation with the ingot I over only about ¼ of the circumference of the crystal ingot near the bottom of the heating element 51. Thus, it may be seen that the heating element 51 radiates more heat to the crystal at its top than at its bottom. It is understood, however, that the heating element 51 may have heating segments 55 of equal length without departing from the scope of this invention.

Figure 3:
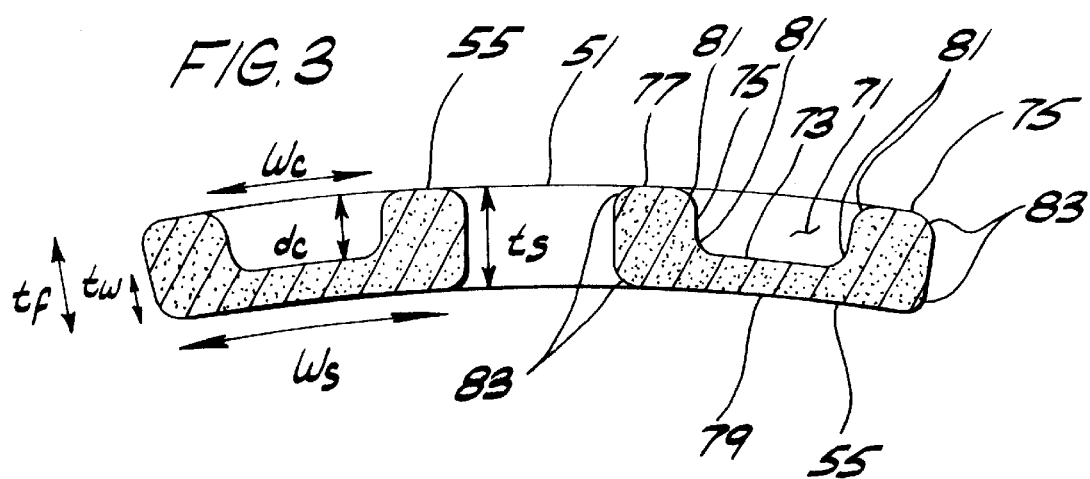
FIG. 3 is a partial section taken in the plane of line 3—3 of FIG. 2 showing the cross-section of a pair of heating segments of the electrical resistance heater.

Referring to FIGS. 2 and 3, each heating segment 55 has a channel 71 extending longitudinally therein along substantially the entire length of the segment to define a central web 73 and opposing flanges 75 of the segment. The flanges project outwardly from the ends of the web in non-coplanar relationship with the web. In the illustrated embodiment, the web 73 and flanges 75 are arranged such that the cross-section of each heating segment 55 is generally U-shaped. The thickness $t_w$ of the central web 73 is substantially less than the thickness $t_f$ of each of the flanges 75. The channel 71 is preferably formed in an outer surface 77 of the segment 55 for ease of construction of the heater 21 since, as discussed later herein, machining the channel into the outer surface is substantially less complicated than machining the channel into an inner surface 79 of the heating segment. However, it is understood that the channel may be formed in the inner surface of each segment without departing from the scope of this invention.

The cross-sectional areas of the heating segments 55 are substantially equal along the lengths of the segments so that the resistance is generally constant throughout the heating element 51. Thus, the temperature of the heat radiated by the heating element 51 is generally uniform along its length. The channels 71 of the illustrated embodiment are generally rectangular and are sized such that the flanges 75 of the heating segment 55 are wider than the thickness $t_w$ of the central web 73 of the segment. Corners 81 of each channel 71, as well as outer corners 83 of each heating segment 55 are preferably rounded to reduce the risk of chipping the silicon carbide coating from the heating element 51 during manual handling of the heater 21 such as during installation in or removal from the crystal puller housing 25. Providing rounded corners also reduces the risk of arcing between the heating element 51 and grounded surfaces of the crystal puller 23.

Figure 4:
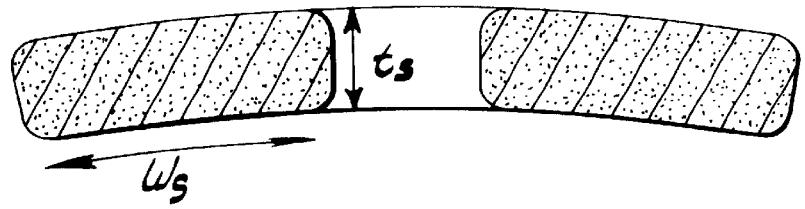
FIG. 4 is a partial section similar to FIG. 3 of a prior art electrical resistance heater.

As an example, each heating segment (FIG. 4) of the conventional heater has a cross-sectional width $w_s$ of 18.9 mm and thickness $t^s$ of 6.25 mm, providing a cross-sectional area of about 118 mm². The resistance provided by this cross-sectional area is approximately 0.122 ohms. Using a conventional power supply (not shown) capable of providing a maximum input current of 350 amperes and maximum input voltage of 60 volts to the heating element, the 0.122 ohms resistance of the heating segment limits the input voltage to about 42.8 amperes before the 350 amperes maximum input current is reached. The total heater power output is thus limited to about 15 kW. Each heating segment 55 of the heating element 51 of FIG. 3 also has a cross-sectional width $w_s$ of 18.9 mm and overall thickness $t^s$ of 6.25 mm. The channel 71 in the outer surface 77 of each heating segment 55 has a width $w_c$ of 9.23 mm and a depth $d_c$ of 4.04 mm; the central web of the segment thus having a thickness $t_s$ of 2.21 mm. As such, the cross-sectional area of the heating segment 55 of the heating element 51 is about 81 mm². Decreasing the cross-sectional area of the heating segment 55 increases the resistance of each heating segment to about 0.171 ohms, substantially higher than the resistance provided by the conventional heater. Using the same conventional power supply, the heating element is now capable of reaching the maximum voltage input of 60 volts as the input current reaches the maximum 350 amperes. The total power output of the heating element is thereby increased to 21 kW. Thus, providing the channel 71 increases the total power output of the heating element 51 of the heater 21 when the maximum heater output power is determined, for example, by the maximum available input current from the power supply. The U-shaped cross-section of each heating segment 55 has a greater radial bending stiffness than a rectangular cross-section of the same cross-sectional area. As such, providing the U-shaped cross-section sufficiently maintains mechanical bending stiffness of the heater 21 despite the reduction in cross-sectional area of the heating segments in comparison with the conventional heater shown in FIG. 4.

Figure 5:
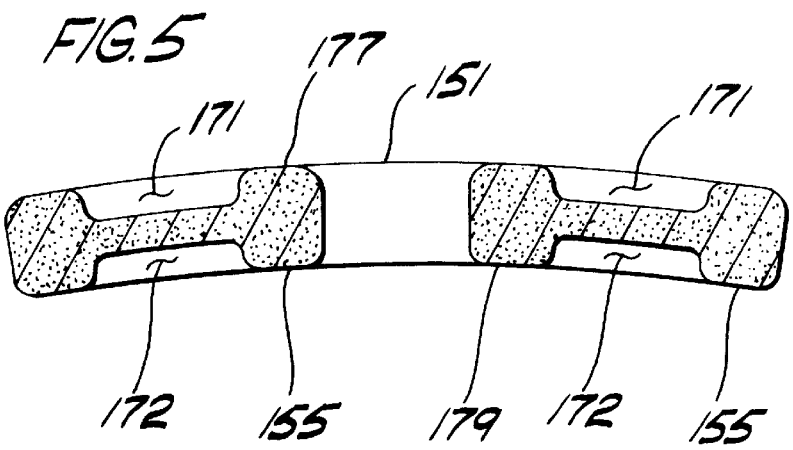
FIG. 5 is a partial section similar to FIG. 3 of an electrical resistance heater of a second embodiment of the present invention.

FIG. 5 illustrates a cross-section of a heating element 155 of a second embodiment of the electrical resistance heater 21. Construction of this second embodiment heater 21 is substantially similar to the heater described above and shown in FIGS. 1 and 2 in that it comprises a heating element 151 having heating segments 155 arranged in serpentine configuration. In this second embodiment, channels 171, 172 are formed in both outer and inner surfaces 177, 179 of each heating segment 155 of a heating element 151 to define a generally I-shaped cross-section of each segment. The I-shaped cross-section of each heating segment 155 similarly maintains sufficient mechanical bending stiffness of the heating element 151 in the radial direction while reducing the cross-sectional area of the heating segments in comparison to the conventional heater shown in FIG. 4 having heating segments of a rectangular cross-sections. It is also undertsood that other web and flange arrangements may be formed to define cross-sections having other shapes without departing from the scope of this invention. For example, a single flange may be used to define an L-shaped cross-section, a T-shaped cross-section, other suitable shape.

With particular reference to FIGS. 1–3, in a preferred method of construction of the heating element 51, portions of a tube (not shown) formed of the resistive heating material are cut away to generally define the profiled configuration of the heating segments 55. The tube is then placed over an arbor (not shown) and the channels 71 are machined into the outer surface of the tube in the desired serpentine pattern. Where channels 172 are to be fabricated into the inner surfaces 179 of the heating segments 155, such as shown in FIG. 5, the tube is supported within a collet (not shown) and the channels are machined with a right-angle milling head (not shown) that reaches into the interior of the tube. Vertically extending slots 89, 91 are then cut into the tube to define the heating segments 55 of the heating element 51. Downward extending slots 89 extend down from the top of the heating element 51 and terminate short of the lower ends 59 of the heating segments 55, leaving adjacent segments connected to each other at the lower ends. Upward extending slots 91 extend up from the lower ends 59 of the segments 55 and terminate short of the top of the heating element 51, leaving adjacent segments connected to each other at the upper ends 57 of these segments. Alternating the downward and upward extending slots 89, 91 about the circumference of the heating element 51 creates the serpentine configuration of the heating element.

In operation, polycrystalline source material (e.g., "polysilicon") is deposited in the crucible 31 and melted by heat radiated from the crucible heater 37. A seed crystal 49 is brought into contact with the molten source material M and a single crystal ingot I is grown by slow extraction via the pulling mechanism. The growing ingot begins cooling at a substantial cooling rate immediately as it is pulled upward from the melt.

The ingot I continues cooling at this substantial rate as it is pulled upward through the lower crystal growth chamber 27 and upper pull chamber 29. When the ingot I approaches the bottom of the heating element 51 of the heater 21, the temperature of the growing ingot has cooled from an initial temperature of about 1400° C. at the liquid-solid interface to around 1100° C. As portions of the ingot I come into radial registration with the longest segments of the heating element 51, heat is radiated to these portions to reduce the rate of further cooling. As the ingot I is pulled upward through the heating element 51 the number of heating segments 55 radiating heat to the ingot gradually increases. The gradual increase in heating power uniformly counters the increased exposure of the ingot I to the cooling effects of the upper pull chamber side wall as the ingot is pulled upward to and above the top of the heating element 51, thereby maintaining the cooling rate of the ingot at a generally uniform rate.

The electrical resistance heater 21 of the present invention is shown and described herein as a secondary or upper heater adapted for mounting in the upper pull chamber 29 of the crystal puller housing 25. However, it is understood that the crucible heater 37 may also be replaced by an electrical resistance heater constructed in accordance with the present invention without departing from the scope of this invention.

It will be observed from the foregoing that the electrical resistance heater 21 described herein satisfies the various objectives of the present invention and attains other advantageous results. Fabricating the heating segments 55 of the heating element 51 to have longitudinally extending channels 71 reduces the cross-sectional area of each heating segment while maintaining sufficient mechanical bending stiffness of the segments. The risk of damaging the heater 21 during installation or removal of the heater into or out of the crystal puller housing 25 is substantially reduced by the preservation of mechanical bending stiffness. In addition, the reduced cross-sectional area of each heating segment 55 provides increased resistance to electrical current flowing through the heating element 51, thereby increasing the total power output of the heater 21. The heater 21 thus provides a more efficient use of the voltage input to the heating element 51.

As various changes could be made in the above constructions without departing from the scope of the invention, it is intended that all matter contained in the above description or shown in the accompanying drawings shall be interpreted as illustrative and not in a limiting sense.

What is claimed is:

1. An electrical resistance heater for use in a crystal puller used for growing monocrystalline ingots according to the Czochralski method, the crystal puller having a housing, a crucible in the housing for containing molten source material and a pulling mechanism for pulling a growing ingot upward from the molten source material, the heater comprising a heating element sized and shaped for placement in the housing of the crystal puller for radiating heat within the housing, the heating element having heating segments arranged in a generally side-by-side relationship and being electrically connected together, each heating segment comprising a web and a flange projecting outwardly from the web and being non-coplanar therewith thereby to reduce the cross-sectional area of the segment for increasing the electrical resistance and power output of the heater, the web and the flange being sized relative to each other such that the thickness of the web is substantially less than the width of the flange.

2. An electrical resistance heater as set forth in claim 1 wherein each of said heating segments has an upper end and a lower end, the upper ends of the heating segments being generally co-planar at the top of the heating element.

3. An electrical resistance heater as set forth in claim 1 wherein the heating segments of the heating element are disposed in a closed geometrical arrangement and electrically connected together for conducting an electric current around the heating element, the segments being constructed of an electrically resistant material so that heat is generated by the resistance of the segments to the flow of electrical current therethrough.

4. An electrical resistance heater as set forth in claim 3 wherein the heating segments are electrically connected in a serpentine configuration.

5. An electrical resistance heater as set forth in claim 3 wherein the heating element is constructed of a silicon carbide coated graphite material.

6. An electrical resistance heater as set forth in claim 1 in combination with the crystal puller.

7. An electrical resistance heater for use in a crystal puller used for growing monocrystalline ingots according to the Czochralski method, the crystal puller having a housing, a crucible in the housing for containing molten source material and a pulling mechanism for pulling a growing ingot upward from the molten source material, the heater comprising a heating element sized and shaped for placement in the housing of the crystal puller for radiating heat within the housing, the heating element having heating segments arranged in a generally side-by-side relationship and being electrically connected together, each heating segment comprising a web and a pair of flanges projecting outwardly from the web and being non-coplanar therewith thereby to reduce the cross-sectional area of the segment for increasing the electrical resistance and power output of the heater, one of said flanges being disposed at an end of the web and the other of said flanges being disposed at an opposing end of the web, the web and flanges being sized relative to each other such that the thickness of the web is substantially less than the width of each of said flanges.

8. An electrical resistance heater as set forth in claim 7 wherein each heating segment has a generally U-shaped cross-section.

9. An electrical resistance heater as set forth in claim 7 wherein each heating segment has a generally I-shaped cross-section.

10. An electrical resistance heater for use in a crystal puller used for growing monocrystalline ingots according to the Czochralski method, the crystal puller having a housing, a crucible in the housing for containing molten source material and a pulling mechanism for pulling a growing ingot upward from the molten source material, the heater comprising a heating element sized and shaped for placement in the housing of the crystal puller for radiating heat within the housing, the heating element having heating segments arranged in a generally side-by-side relationship and being electrically connected together, each heating segment comprising a web and a flange projecting outwardly from the web and being non-coplanar therewith thereby to reduce the cross-sectional area of the segment for increasing the electrical resistance and power output of the heater, said heating segments comprising first and second heating segments, each heating segment having an upper end and a lower end, the second heating segment having a length substantially greater than the first heating segment and being arranged relative to the first segment so that when the heating element is placed in the housing the lower end of the second segment is disposed closer to the molten silicon in the crucible than the lower end of the first segment when the heating element is placed in the housing.

11. An electrical resistance heater as set forth in claim 7 wherein the heating element is constructed such that the heating power output generated by the heating element gradually increases from the bottom to the top of the heating element.

\* \* \* \* \*

UNITED STATES PATENT AND TRADEMARK OFFICE
CERTIFICATE OF CORRECTION

PATENT NO. : 6,285,011 B1
DATED : September 4, 2001
INVENTOR(S) : Carl F. Cherko Page 1 of 1

It is certified that error appears in the above-identified patent and that said Letters Patent is hereby corrected as shown below:

Column 10,
Line 19, please change "7" to read -- 10 --.

Signed and Sealed this

Fourteenth Day of May, 2002

*Attest:*

*Attesting Officer*

JAMES E. ROGAN
*Director of the United States Patent and Trademark Office*